United States Patent [19]
Yamazaki

[11] Patent Number: 5,895,963
[45] Date of Patent: Apr. 20, 1999

[54] SEMICONDUCTOR DEVICE HAVING OPENING PORTION FOR FUSE BREAKAGE

[75] Inventor: Yasushi Yamazaki, Tokyo, Japan

[73] Assignee: NEC Corporation, Tokyo, Japan

[21] Appl. No.: 09/019,737

[22] Filed: Feb. 6, 1998

[30] Foreign Application Priority Data

Feb. 7, 1997 [JP] Japan .................................. 9-024683

[51] Int. Cl.$^6$ .............................................. H01H 85/046
[52] U.S. Cl. ..................... 257/529; 257/665; 337/290; 337/142
[58] Field of Search ........................... 257/529, 665; 337/290, 142

[56] References Cited

U.S. PATENT DOCUMENTS

| | | | |
|---|---|---|---|
| 5,235,205 | 8/1993 | Lippitt, III | 257/529 X |
| 5,578,861 | 11/1996 | Kinoshita et al. | 257/529 |
| 5,723,898 | 3/1998 | Gilmour et al. | 257/529 |
| 5,754,089 | 5/1998 | Chen et al. | 257/529 X |

*Primary Examiner*—John Guay
*Attorney, Agent, or Firm*—Sughrue, Mion, Zinn, Macpeak & Seas, PLLC

[57] ABSTRACT

A semiconductor device according to the present invention comprises a fuse provided on a substrate, a first insulating layer formed on the substrate and the first insulating layer, a first wiring formed on the first insulating layer, a second insulating layer formed on the first wiring, the second insulating layer including a plurality of insulating films including a water absorptive overcoat, a second wiring formed on the second insulating layer, an opening portion formed in a portion of the second insulating layer corresponding to the fuse by selectively removing the portion and having a side face formed by an exposed portion of the second insulating layer and a bottom face formed by the exposed first insulating layer, a side wall film formed of the same material as that of the second wiring and covering the exposed side face of the opening portion and a passivation film formed on the second insulating layer, the second insulating layer and the side wall film.

13 Claims, 3 Drawing Sheets

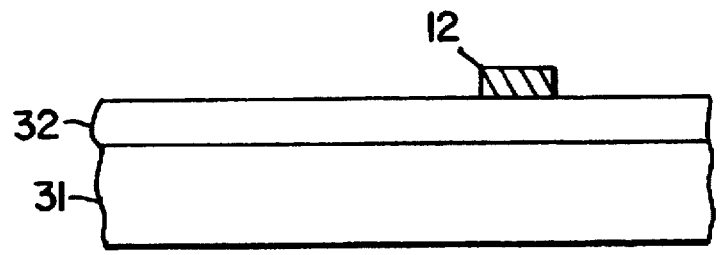
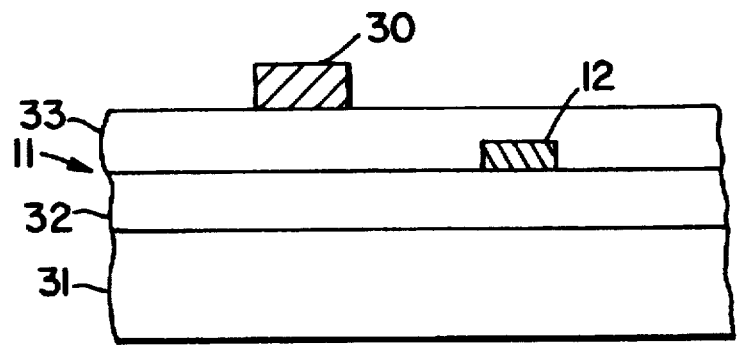
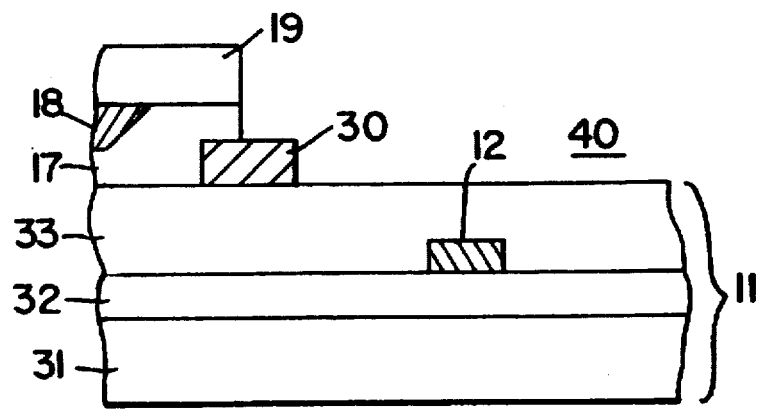
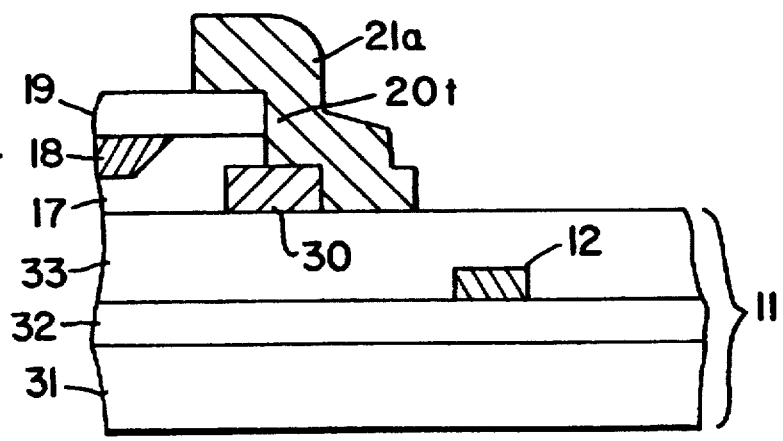

SEMICONDUCTOR DEVICE HAVING OPENING PORTION FOR FUSE BREAKAGE

BACKGROUND OF THE INVENTION

The present invention relates to a semiconductor device having an opening portion for breaking a fuse and, particularly, to a structure of the opening portion. Description of the related Art It has been known that some of semiconductor devices such as DRAMs, SRAMs or ROMs, etc., are constructed such that, in order to improve the yield of products, extra memory cells, that is, redundancy memory cells in addition to a predetermined number of memory cells are provided and, when a specific memory cell of the memory cells, whose performance is not acceptable, is found in a fabrication thereof, the specific memory cell can be replaced by one of the redundancy cells.

In such semiconductor device, in order to replace such defective memory cell by the redundancy memory cell, redundancy fuses for replacement of the usual memory cell by the redundancy memory cell are buried therein so that the defective memory cell is disconnected by cutting away a redundancy fuse corresponding to the defective memory cell by laser light, etc., and the redundancy memory cell is connected in place.

On the other hand, in the semiconductor device having the redundancy fuses buried therein, a multi-layer wiring has been employed in order to accommodate it to the increased integration and density. When the multi-layer wiring is employed, an overcoat covering the multi-layer wiring should be as flat as possible in view of prevention of breakage of wiring. Therefore, the overcoat is usually formed by an SOG (Spin On Glass) film, that is, a silica film, which is superior in flatness and covering ability. As such, in a semiconductor device which uses an SOG film as the overcoat film between wiring, an opening portion is formed on an insulating film of BPSG, etc., formed on a redundancy fuse buried therein, which opening portion has a depth not enough to expose the redundancy fuse, to facilitate the breakage of the redundancy fuse by laser light. In such case, a portion of the SOG film is exposed on a side face of the opening portion on the redundancy fuse.

However, the SOG film itself has a tendency of absorbing water with which it expands. When the SOG film on the side face of the opening is kept exposed, it absorbs water and expands during a use thereof, resulting in cracks in the wiring, etc. Further, there may be a case of wiring corrosion due to existence of water.

In order to prevent the SOG film from absorbing water, a semiconductor device has been proposed, in which the exposure of an SOG film is prevented by providing an insulating side wall of SiN on the exposed side face of the opening portion on an area in which the redundancy fuse is buried.

In the latter case, the formation of the SiN insulating side wall on the exposed portion of the SOG film is performed by forming an SiN film on a whole surface of a wafer including the opening portion and etching it back to remove a portion of the SiN film left on the wafer except the side face portion of the opening portion.

Therefore, in this example, in addition to the step of patterning a cover resist painted to form the opening, the step of depositing an insulating film of such as SiN which has no relation to the wiring and the step of etching back the insulating film are required in order to form the side wall on the SOG film. The latter two steps for forming the insulating film for covering the exposed portion of the SOG film are performed separately from the steps for forming the wiring. Therefore, there is a defect in that the fabrication of the semiconductor device becomes complicated.

Further, in order to prevent water permeation from the exposed SOG film in the opening portion into internal wiring, a semiconductor device having a dummy wiring surrounding the opening portion has been proposed. In such construction, it is possible to form the dummy wiring and other wiring on a single and same layer, so that the fabrication of the semiconductor device can be simplified. However, in order to prevent the water permeation from the exposed SOG film in the opening portion, it is necessary to make a width of the dummy wiring larger to provide a sufficient margin. Therefore, an increase of area due to the dummy wiring having large width is indispensable. Even so, however, it has been observed that water still permeates from the exposed portion of the SOG film along the SOG film into the wiring.

BRIEF SUMMARY OF THE INVENTION

Object of the Invention

An object of the present invention is to provide a semiconductor device capable of preventing water permeation from an SOG film without increasing the number of fabrication steps.

SUMMARY OF THE INVENTION

A semiconductor device according to the present invention comprises at least one fuse provided on a substrate, a first insulating film formed on the substrate and the fuse, a first wiring formed on the first insulating film, a second insulating layer formed on the first wiring layer and having a plurality of insulating films including a water absorptive overcoat film, a second wiring formed on the second insulating layer, at least one opening portion formed in a portion of the second insulating film corresponding to the fuse by selectively removing the portion and having a side face formed by an exposed portion of the second insulating layer and a bottom face formed by the exposed first insulating layer, a side wall film formed of the same material as that of the second wiring and covering the exposed side face of the opening portion and a passivation film formed on the second insulating layer and the side wall film.

BRIEF DESCRIPTION OF THE DRAWINGS

This above-mentioned and other objects, features and advantages of the present invention will become more apparent by reference to the following detailed description of the present invention taken in conjunction with the accompanying drawings, wherein:

FIGS. 5(a) to 5(d) are cross sections showing fabrication steps of a fabrication method for fabricating the semiconductor device of the second embodiment.

DETAILED DESCRIPTION OF THE INVENTION

Figure 1:
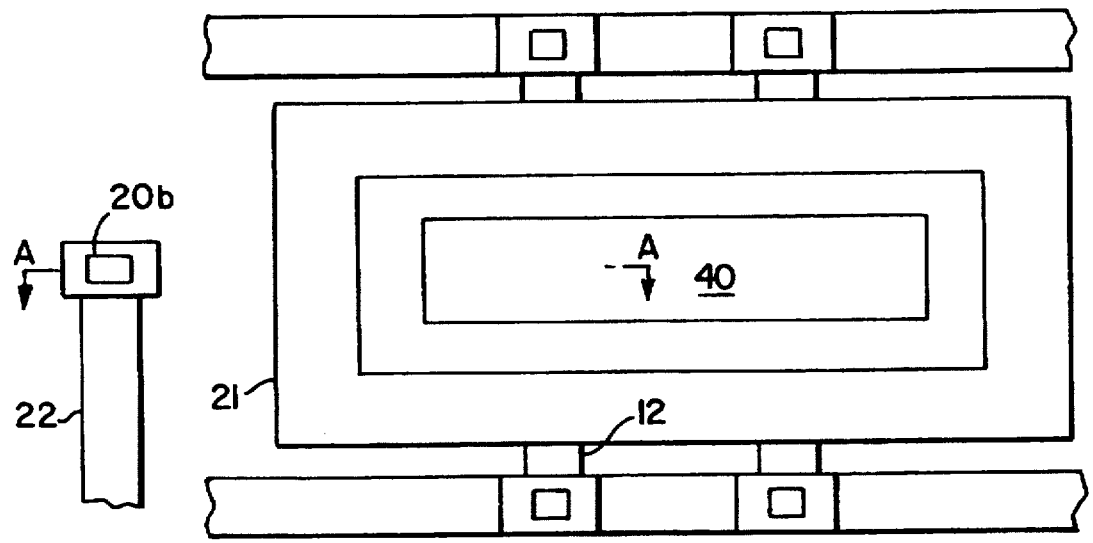
FIG. 1 is a plan view of a semiconductor device according to a first embodiment of the present invention.
Figure 2:
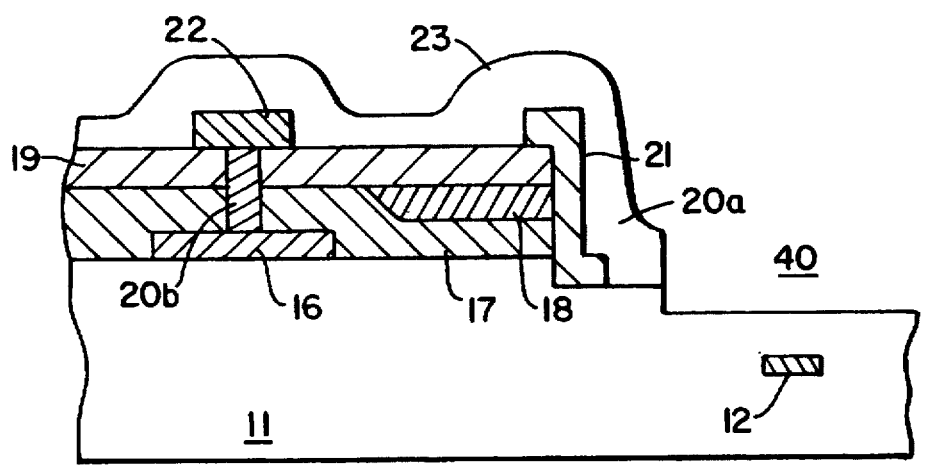
FIG. 2 is a cross section taken along a line A—A in FIG. 1.

A first embodiment of the present invention will be described with reference to FIG. 1 which is a plan view thereof and FIG. 2 which is a cross section thereof. As shown in FIGS. 1 and 2, an opening portion 40 is formed in an area corresponding to a buried redundancy fuse 12. An inter-layer insulating film formed on the opening portion 40 is made thinner than other area thereof in order to facilitate cutting of the redundancy fuse 12 by laser light. With the formation of this opening portion 40, an insulating film including a PBSG film is removed and a PSG film is exposed on a side face of the opening portion 40. One of features of the present invention is a provision of a metal side wall portion 21 on the side face of the opening portion 40. The metal side wall portion 21 is formed such that it surrounds the opening portion 40.

In other area of the wafer than the opening portion, contact holes, etc., are formed for connecting, for example, an upper layer wiring 22 of a multi-layer wiring to a lower wiring thereof.

The first embodiment of the present invention will be described in more detail with respect to FIG. 2.

The redundancy fuse 12 is buried in the inter-layer insulating film 11 such as BPSG. The redundancy fuse 12 is formed of tungsten silicide, etc. Incidentally, it is practical that semiconductor elements such as DRAM, etc., are formed in a lower region of the inter-layer insulating film 11 and a redundancy semiconductor element which is also formed in that region is connected in lieu of one of the semiconductor elements which is defective by cutting the redundancy fuse 12. However, in order to simplify the description of the present invention, details thereof are omitted in this description.

A first wiring 16 of, for example, Al is formed on the inter-layer insulating film 11. The first wiring 16 is patterned by etching and the patterned first wiring 16 is covered by a first insulating film 17. The first insulating film 17 is a silicon oxide film formed by CVD, etc. By covering the patterned first wiring 16 by the first insulating film 17, there are steps formed between the first wiring 16 and the first insulating film 17. Such steps may cause a breakage of wiring, etc., of a multi-layer wiring formed above them.

In order to eliminate such steps and to flatten a surface of the wafer, an SOG film 18 is deposited thereon as an overcoat film and then the overcoat film is etched back. As a result, the first insulating film 17 and the SOG film 18 form a flat surface. A second insulating film 19 is formed on the flat surface formed of the first insulating film 17 and the SOG film 18. The second insulating film 19 in this embodiment is a silicon oxide film formed by CVD, etc.

Thereafter, a photo resist (not shown) is painted on the second insulating film 19 and exposed and portions of the photo resist on the contact holes and the opening portion 40 are selectively removed. The contact holes and the opening portion 40 are formed by etching by using the photo resist. In this case, the second insulating film 19, the SOG film 18, the first insulating film 17 and a portion of the inter-layer insulating film 11 in a region 20a are etched away.

After this etching, the photo resist left on the second insulating film 19 is removed.

In this manner, the opening portion 40 is formed in the region above the redundancy fuse 12. After the contact holes for the multi-layer wiring are formed on the first wiring 16, a second metal film is formed inside the opening portion 40 and the contact holes by sputtering and a metal side wall portion 21 and a second wiring 22 are formed by selectively removing the second metal film by selective patterning. The second metal forming the metal side wall portion 21 and the second wiring 22 is aluminum.

Then, after a passivation film 23 of SiN, etc., is formed on the whole surface of the wafer to a thickness of 500 to 1000 nm by CVD as a cover film, a portion of the cover film on the opening portion 40 is removed by dry-etching. In this etching step, the inter-layer insulating film 11 is also partially etched away, leaving the inter-layer insulating film 11 having a thickness small enough to be easily removed by laser light on the fuse 12.

As mentioned above, in the first embodiment of the present invention, the water absorptive SOG film 18 is covered by the side wall portion 21 of the same metal material as that of the second wiring 22 and further by the passivation film 23. Since the SOG film 18 is covered by the metal side wall portion 21 and the passivation film 23, it is possible to completely prevent the permeation of water into the semiconductor device. Further, in the shown semiconductor device, the second wiring 22 which constitutes the uppermost wiring and the metal side wall portion 21 covering the SOG film 18 can be formed simultaneously and thus the metal side wall portion 21 can be formed in the same fabrication step as that of the wiring. Therefore, the fabrication step can be simplified.

Now, a second embodiment of the present invention will be described with reference to FIGS. 3 and 4, in which the same or corresponding portions to those shown in FIGS. 1 and 2 are depicted by the same reference numerals, respectively. In the second embodiment, a first wiring 16 of a first metal material such as aluminum is formed on an inter-layer insulating film 11 in which a redundancy fuse 12 is buried and a dummy wiring 30 is formed in a peripheral portion of an opening portion 40. The dummy wiring 30 is of the first metal material. Therefore, the first wiring 16 and the dummy wiring 30 can be formed in the same fabrication step.

Figure 3:
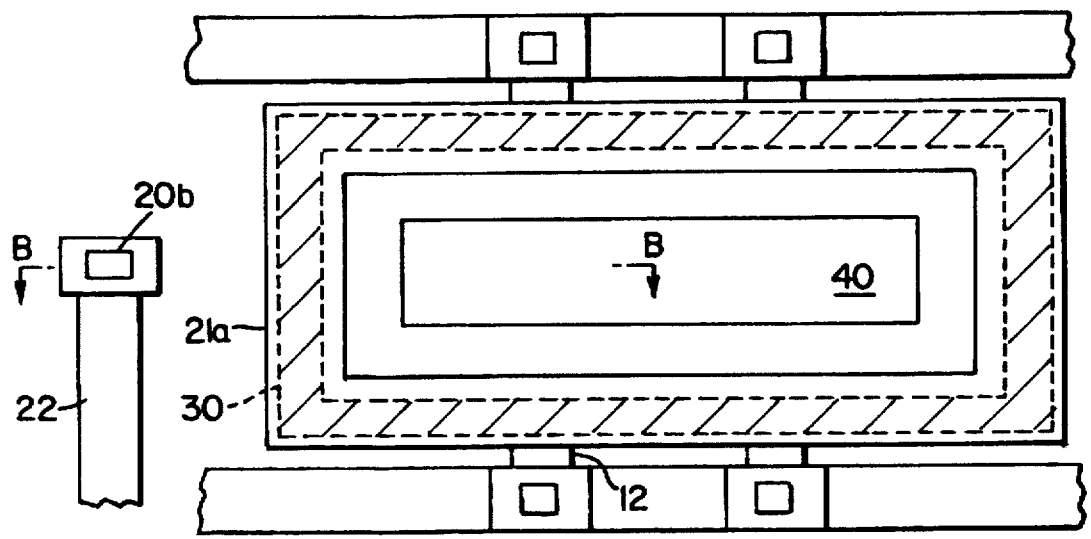
FIG. 3 is a plan view of a semiconductor device according to a second embodiment of the present invention.
Figure 4:
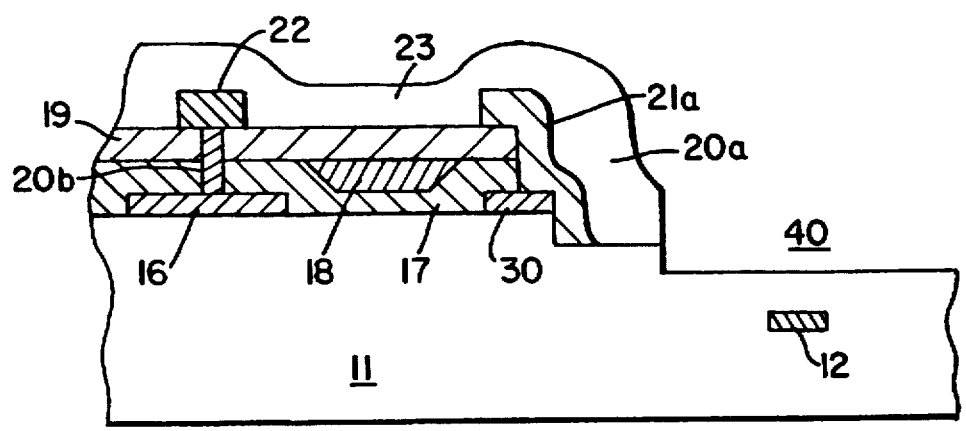
FIG. 4 is a cross section taken along a line A—A in FIG. 3.

As shown in FIGS. 3 and 4, the dummy wiring 30 is covered by a first insulating film 17. Therefore, the first insulating film 17 covering the first wiring 16 and the dummy wiring film 30 has a step, that is, a recess, between the first wiring 16 and the dummy wiring 30.

After an SOG film 18 is formed uniformly on surfaces of the first wiring 16 and the dummy wiring 30, the SOG film 18 is etched back such that the first insulating film 17 and the SOG film 18 form a common flat surface. As a result, a portion of the SOG film 18 is left isolated in the recess of the first insulating film 17.

On the flat surface formed by the first insulating film 17 and the SOG film 18, a second insulating film 19 such as a silicon oxide film is deposited by CVD, etc., and then the opening portion 40 and contact holes are formed by lithography and wet-etching. In this case, the dummy wiring 30 functions as an etching stopper.

After the formation of the opening portion 40 and the contact holes, a second wiring 22 and a metal side face cover 21a are formed of a second metal material such as aluminum in a fabrication step. In this structure, the metal side wall cover portion is formed by the metal side face cover 21a and the dummy wiring 30 and the metal side wall cover portion prevents the SOG film 18 from being exposed.

By forming the dummy wiring 30 in the peripheral portion of the opening portion 40 and forming the first insulating film 17 on the dummy wiring 30 in this manner, a weir or dam is formed for the SOG film 18. Therefore, the SOG film 18 is not exposed and a margin of the through-hole wet-etching can be made large.

After the formation of the metal side wall cover portion, a passivation film 23 of such as SiN is formed by CVD, etc. In this construction, the SOG film 18 is sealed in the recess formed in the first insulating film 17 and the SOG film 18 is completely isolated from the opening portion 40 by the passivation film 23. Therefore, the water permeation into the SOG film 18 can be prevented completely.

A fabrication method of the second embodiment of the present invention will be described with reference to FIGS. 5(a) to 5(d). First, as shown in FIG. 5(a), an insulating film 32 such as a silicon oxide film is formed on a surface of a silicon substrate 31. Then, a fuse 12 of tungsten silicide or doped polysilicon, etc., is selectively formed on the insulating film 32.

Thereafter, as shown in FIG. 5(b), the fuse 12 is covered by an inter-layer insulating film 33 of BPSG, etc., and the inter-layer insulating film is flattened. On the inter-layer insulating film 33, the dummy wiring 30 and the first wiring (not shown) of the first metal material are formed simultaneously in one step.

Although, in FIG. 5(b), the dummy wiring 30 is shown in cross section, the dummy wiring 30 forms in plan view a rectangular loop surrounding the peripheral portion of the opening portion 40 as shown in FIG. 3.

Then, as shown in FIG. 5(c), the first insulating film 17 is formed on the patterned dummy wiring 30 and the first wiring and, thereafter, the SOG film 18 is painted on the first insulating film 17 as the overcoat film. After the SOG film 18 is painted, the surface of the SOG film 18 and the first insulating film 17 is flattened by etching back. As a result, the SOG film 18 is left in only the recess of the first insulating film 17 as shown in FIG. 4 and isolated from the opening portion 40 positioned on the right side of the dummy wiring 30.

On the flattened surface of the first insulating film 17 and the SOG film 18, the second insulating film 19 is deposited and then the opening portion 40 and the contact holes are formed simultaneously by lithography. In this case, the opening portion 40 occupies an area including a portion of an area of the dummy wiring 30 as shown in FIG. 5(c) and, therefore, portions of the second and first insulating films 19 and 18 formed on the dummy wiring 30 are removed. The first and second insulating films 17 and 19 are exposed in the side wall of the opening portion 40 and the SOG film 18 is not exposed.

As shown in FIG. 5(d), after the formation of the opening portion 40, a second metal film of aluminum, etc., is formed on the opening portion 40 and the second insulating film 19 and selectively etched by lithography. By this selective etching, the metal side face cover 21a of the second metal material is formed such that the metal side face cover 21a covers the side wall of the opening portion 40, the dummy wiring 30 and a portion of the second insulating film 19. Therefore, the exposed portion of the first and second insulating films 17 and 19 are completely covered by the meal side face cover 21a and the dummy wiring 30 of the first metal material is also covered by the metal side face cover 21a. Thus, in the shown structure, the SOG film 18 is isolated from the opening portion 40 by the dummy wiring 30 and the metal side face cover 21a.

Thereafter, the passivation film 23 is formed, so that the SOG film 18 is also isolated from the opening portion 40 by the metal side face cover 21a and the passivation film 23.

Incidentally, although only the water permeation into the SOG film has been described in these embodiments, the present invention is similarly applicable to a case where a water absorptive overcoat film is used.

Further, although the multi-layer wiring has been described as a double layer wiring, the present invention is also applicable to a multi-layer wiring including a larger number of wiring layers by forming a metal side face cover simultaneously with a formation of the uppermost wiring layer. Further, the dummy wiring is formed of the same metal material as that of a wiring which is formed before the SOG film is painted, simultaneously with the formation of the wiring. Further, although, in the above embodiment, wiring layers other than the uppermost wiring layer have been described as being formed of metal material, the material of these wiring layer may be other than metal, so long as the material is electrically conductive which can be used as wiring material.

Although the present invention has been described with reference to specific embodiments, this description is not meant to be construed in a limiting sense. Various modifications of the disclosed embodiments will become apparent to persons skilled in the art upon reference to the description of the present invention. It is, therefore, contemplated that the appended claims will cover any modifications or embodiments as fall within the true scope of the present invention.

What is claimed is:

1. A semiconductor device comprising:

a fuse provided on a substrate;

a first insulating layer formed on said substrate and said fuse;

a first wiring formed on said first insulating layer;

a second insulating layer formed on said first wiring, said second insulating layer including a plurality of insulating films including a water absorptive overcoat;

a second wiring formed on said second insulating layer;

an opening portion formed in a portion of said second insulating layer corresponding to said fuse by selectively removing the portion and having a side face formed by an exposed portion of said second insulating layer and a bottom face formed by said exposed first insulating layer;

a side wall film formed of the same material as that of said second wiring and covering said exposed side face of said opening portion; and a passivation film formed on said second insulating layer, said second insulating layer and said side wall film.

2. A semiconductor device as claimed in claim 1, wherein said water absorptive overcoat comprises an SOG film.

3. A semiconductor device as claimed in claim 1, wherein said second wiring and said side wall film are formed in one step.

4. A semiconductor device as claimed in claim 1, further comprising a dummy wiring formed in a peripheral portion of said opening portion and having a portion thereof protruding from said side face of said opening portion.

5. A semiconductor device as claimed in claim 4, wherein said protruded portion of said dummy wiring is covered by said side wall film.

6. A semiconductor device comprising:

a substrate having a fuse provided therein;

a first wiring formed on said substrate;

a first insulating layer formed on said first wiring;

an overcoat film for flattening a step portion of said first insulating film provided by said first wiring;

a second insulating layer formed on said first insulating layer and said overcoat film;

a second wiring formed on said second insulating layer;

an opening portion formed by exposing said substrate by selectively removing said first and second insulating layers on said fuse; and an electrically conductive cover film covering a whole side face of said opening portion.

7. A semiconductor device as claimed in claim 6, further comprising a passivation film formed on said second wiring, said second insulating film and said cover film.

8. A semiconductor device as claimed in claim 6, wherein said overcoat film comprises an SOG film.

9. A semiconductor device as claimed in claim 6, wherein said second wiring and said cover film are formed of the same material in one and the same step.

10. A semiconductor device as claimed in claim 6, further comprising a dummy wiring formed in a peripheral portion of said opening portion and having a portion thereof protruding from said side face of said opening portion.

11. A semiconductor device as claimed in claim 10, wherein said protruded portion of said dummy wiring is covered by said side wall film.

12. A semiconductor device comprising:

a substrate having a fuse provided therein;

a dummy wiring in a shape of loop formed on said substrate correspondingly to said fuse;

an insulating layer formed in a peripheral portion of said dummy wiring and having a side face including a multi-layer wiring covering a portion of said dummy wiring; and an electrically conductive cover film covering a whole of said side face of said insulating layer and said dummy wiring.

13. A semiconductor device as claim in claim 12, wherein said cover film is formed of the same material as that of an uppermost wiring of said multi-layer wiring in one and the same step.

* * * * *